(12) United States Patent
Pitz

(10) Patent No.: US 7,061,325 B2
(45) Date of Patent: Jun. 13, 2006

(54) DIGITAL COMPENSATION FOR OFFSET AND GAIN CORRECTION

(75) Inventor: Jeanne Krayer Pitz, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 173 days.

(21) Appl. No.: 10/749,655

(22) Filed: Dec. 31, 2003

(65) Prior Publication Data
US 2005/0140450 A1   Jun. 30, 2005

(51) Int. Cl.
*H03G 3/10* (2006.01)
(52) U.S. Cl. .......................... 330/279; 330/289; 330/9
(58) Field of Classification Search ................ 330/279, 330/289, 9
See application file for complete search history.

(56) References Cited

U.S. PATENT DOCUMENTS

| | | | | |
|---|---|---|---|---|
| 5,848,383 | A | * | 12/1998 | Yunus ........................ 702/104 |
| 6,032,109 | A | * | 2/2000 | Ritmiller, III ................ 702/104 |
| 6,285,958 | B1 | | 9/2001 | Wolf et al. |
| 6,910,381 | B1 | * | 6/2005 | Albert et al. ................. 73/718 |
| 6,917,203 | B1 | * | 7/2005 | Perotti et al. ................ 324/418 |
| 2002/0158688 | A1 | * | 10/2002 | Terosky et al. ............. 330/129 |

OTHER PUBLICATIONS

Alec Makdessian and Mark Parsons; "DSSP-BASED Pressure Sensors"; Sensors, Jan. 2001, www.sensormag.com/articles/0101/38/main.shtml, 11 pages.

* cited by examiner

Primary Examiner—Patricia Nguyen
(74) Attorney, Agent, or Firm—J. Dennis Moore; W. James Brady, III; Frederick J. Telecky, Jr.

(57) ABSTRACT

A system and method for providing digital compensation and correction for an amplifier. The system is configured to provide a digitally compensated representation of a first amplified analog signal indicative of a first parameter based on a digital representation of the first amplified analog signal and a digital representation of a second analog signal indicative of a second parameter. The digitally compensated representation of the first amplified analog signal is determined by applying a pre-stored compensation factor to an offset adjustment calculation for the second parameter to provide a compensated offset adjustment. The compensated offset adjustment is combined with an adjusted gain to provide an offset and gain correction for weighting the first parameter to provide the digitally compensated representation of the first parameter. The adjusted gain can be determined by applying a pre-stored gain factor data to the second parameter.

8 Claims, 3 Drawing Sheets

DIGITAL COMPENSATION FOR OFFSET AND GAIN CORRECTION

TECHNICAL FIELD

The present invention is generally directed to a system for signal processing and more specifically to systems and methods for digital compensation and gain correction.

BACKGROUND OF THE INVENTION

An ideal amplifier provides a constant gain and offset over a wide range of temperatures without the need for feedback control. However, for a real amplifier, the gain and offset vary due to changes in temperature and linearity effects. For example, as operating temperature increases, gain tends to decrease. To overcome temperature effects, the gain and offset of the amplifier is actively compensated.

Gain variations due to temperature changes can be actively compensated using a closed loop feedback circuit. The output power is compared to a reference and any deviation of the output power from the reference power causes a control circuit to adjust the amplifier's gain. This automatic gain compensation technique works as long as the amplifier's behavior across a temperature gradient can be determined or predicted. However, such circuits are difficult to mass produce reliably and often require manual trimming to account for deviations among the closed loop components and the out of loop temperature effects.

Similarly, temperature dependent resistive networks or a closed loop feedback circuit can be used to compensate for offset variation due to temperature or other operating conditions. However, these circuits usually require manually setting the offset initially and are limited by the accuracy of the analog components.

SUMMARY OF THE INVENTION

The present invention is directed to a compensation system configured to provide a digitally compensated representation of a first amplified analog signal indicative of a first parameter based on the first amplified analog signal and a second signal indicative of a second parameter. The digitally compensated representation of the first amplified analog signal is determined by applying a pre-stored compensation factor to an offset adjustment calculation for the second parameter to provide a compensated offset adjustment. The compensated offset adjustment is combined with an adjusted gain to provide an offset and gain correction for weighting the first parameter and to provide a digitally compensated representation of the first parameter. The adjusted gain can be determined by applying a pre-stored gain factor data to the second parameter. The compensation system can be implemented in hardware, software or a combination of hardware and software.

Another aspect of the present invention is directed to a compensation system (e.g. a DSP or ASIC) that compensates for offset and gain error in an analog circuit, such as due to circuit operation and temperature deviation. The compensation system comprises a first register for storing a temperature compensation factor calculation from a digital representation of a temperature and a temperature compensation coefficient. The compensation system includes a second register for storing an offset adjustment calculation from a digital representation of an amplified signal and a fine offset coefficient. A processor combines the temperature compensation factor with the offset adjustment to produce a temperature compensated offset adjustment which is stored in one of the first and second registers. The other of the first and second registers can be used for storing a calculated temperature adjusted gain that is calculated from the digital representation of a temperature, and a gain coefficient. The temperature adjusted gain is combined with the temperature adjusted offset to produce an offset and gain correction. The offset and gain correction can be applied to the amplified signal to provide a compensated representation thereof.

Still another aspect of the present invention is a method for compensating for error associated with an analog circuit. The method comprises determining a temperature compensation factor from a digital representation of a temperature and a temperature compensation coefficient. An offset adjustment is determined based on a digital representation of an amplified signal and a fine offset coefficient. A temperature adjusted gain is determined from the digital representation of a temperature and a gain coefficient. An offset and gain correction is determined based on the temperature compensation factor, the offset adjustment, and the temperature adjusted gain. The offset and gain correction can be applied to a signal provided by the analog circuit to compensate for error associated with the analog circuit.

BRIEF DESCRIPTION OF THE DRAWINGS

The foregoing and other aspects of the present invention will become apparent to those skilled in the art to which the present invention relates upon reading the following description with reference to the accompanying drawings.

DETAILED DESCRIPTION

The present invention relates to systems and methods for providing digital compensation to an amplifier or a sensor. The approach described herein can compensate for offset and/or gain deviations caused by external or internal factors such as temperature or component mismatch. The present invention enables a system to be provided that minimizes the hardware required to perform the compensation functions. Using the approach described herein, systems can be manufactured economically and efficiently compared to many other types of systems.

Figure 1:
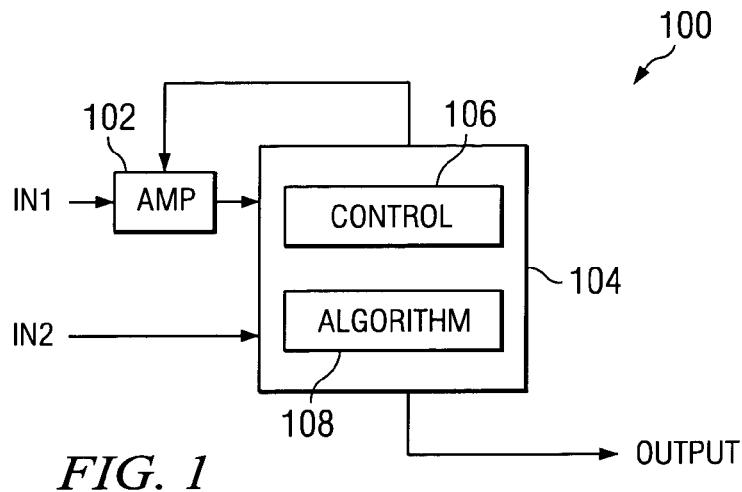
FIG. 1 is a block diagram schematically illustrating an amplifier implemented with digital compensation in accordance with an aspect of the present invention.

Referring to FIG. 1, there is illustrated a system 100 that can be implemented in accordance with an aspect of the present invention. The system 100 comprises a compensation system 104 that is coupled to receive an amplified signal from an amplifier 102. The compensation system could be a Digital Signal Processor (DSP), an application specific integrated circuit (ASIC) or other circuitry programmed and/or configured to perform the functions described herein. The compensation system 104 includes a control 106 for implementing an algorithm 108 that processes an input signal from the amplifier 102. The compensation system 104 provides an output signal that is a digitally compensated representation of the input signal from the amplifier. The compensation system 104 can also provide a control signal to the amplifier 102. For example, the control signal from the compensation system 104 implements a coarse level of compensation for the amplifier (e.g., coarse offset and gain correction) in the analog domain and the algorithm 108 implemented by the control 106 provides a fine level of compensation (e.g., in the digital domain).

For example, the amplifier 102 is an analog amplifier that receives an analog input IN1 that is amplified and provided to compensation system 104. IN1 can be provided by a sensor (not shown), such as a high precision sensor (e.g., a weight sensor). The amplifier can be a high gain amplifier for amplifying IN1 to a desired level (e.g., having a gain greater than about 100, such as about 300 or more). In addition, compensation system 104 receives another input IN2 that represents a parameter indicative of compensation requirements for the amplifier 102. For example, the parameter may be an environmental parameter, such as temperature, or other factor that can affect gain and offset characteristics of the amplifier 102.

Control 106 processes amplified IN1 and IN2 using algorithm 108 and provides the output signal based on IN1 and IN2. The amplified IN1 signal can include errors associated with operation of amplifier 102, such as gain errors and/or offset errors. These and other errors associated with amplifier 102 can be affected by environmental factors, such as temperature. Thus, by providing IN2 as an indication of temperature or one or more other environmental factors, the compensation system 104 can correct for such errors in IN1 as a function of IN2. It will be appreciated that errors associated with amplifier 102 can become even more significant where the amplifier is a high gain amplifier, as may be needed to amplify signals from many types of sensors. The algorithm 108 thus employs IN2 to implement desired compensation on amplified IN1 so that OUTPUT is provided as a digitally compensated representation of IN1, which is a more accurate indication of the parameter indicated by IN1.

According to an aspect of the present invention, the digitally compensated representation of IN1 is determined by algorithm 108 applying a pre-stored compensation factor to an offset adjustment calculation for a parameter represented by IN2 to provide a compensated offset adjustment. The compensated offset adjustment is combined with an adjusted gain for amplifier 102 to provide an offset and gain correction that can be applied to a digital representation of IN1 for weighting the first parameter represented by amplified IN1. Compensation system 104 in turn provides an OUTPUT corresponding to the digitally compensated representation of the first parameter. The adjusted gain can be determined by applying a pre-stored gain factor to the second parameter. Additionally, compensation system 104 can employ IN2 to provide a coarse level of gain and offset correction to amplifier 102. Based on the coarse level of gain and offset correction (indicated as the feedback to amplifier 102), compensation system 104 can implement the fine gain and offset correction digitally via control 106 and algorithm 108. It further will be appreciated that compensation system 104 is equally applicable to single or multi-stage amplifiers.

Figure 2:
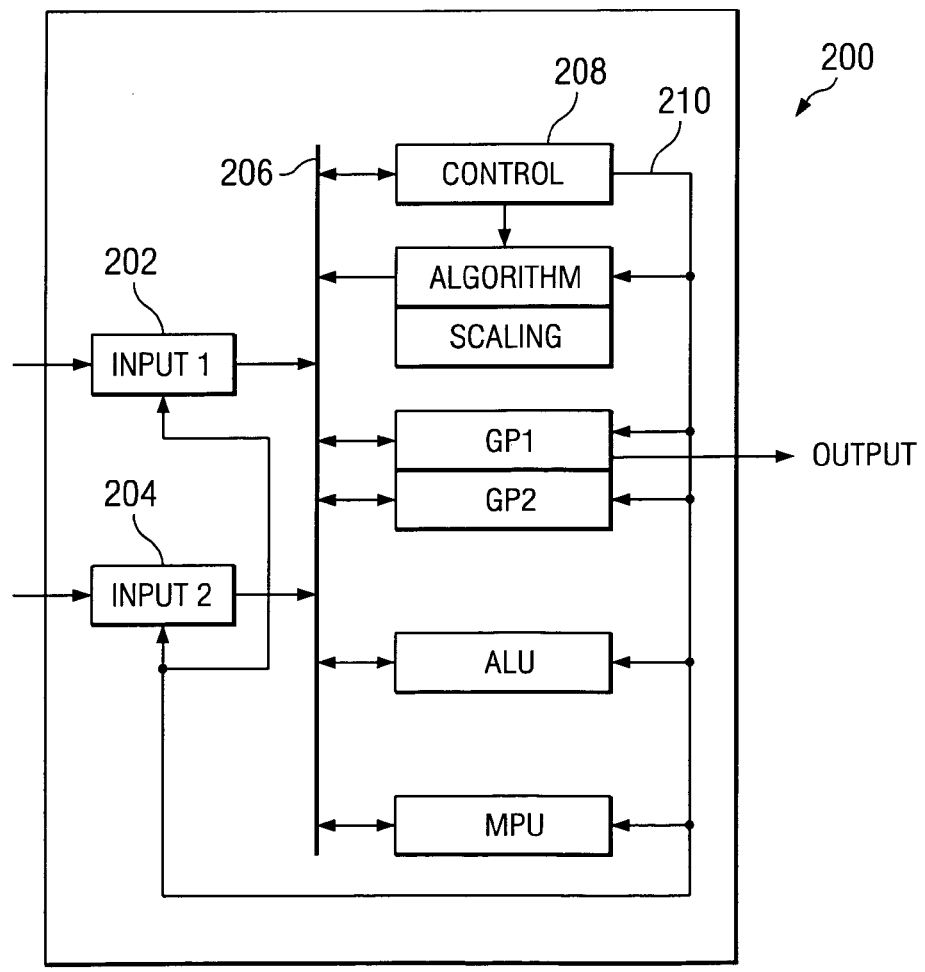
FIG. 2 is a block diagram of the components of a digital compensation system in accordance with an aspect of the present invention.

FIG. 2 illustrates a compensation system 200 in accordance with an aspect of the present invention. Compensation system 200 comprises a first input register 202 and a second input register 204. The registers 202 and 204 store digital representations of corresponding analog signals. For example, register 202 can store a digital representation of an amplified sensor parameter (e.g., weight) and register 204 can store a parameter (e.g., temperature) that can affect offset and/or gain implemented by the amplifier that provides the parameter to register 202. Compensation system 200 also has general purpose registers GP1, GP2. The registers GP1 and GP2 are used for general purpose storage. For example, variables can be input into registers GP1 and GP2 for use in calculations and intermediate results can also be stored in them. The compensation system 200 also includes an arithmetic (or an adding) logic unit (ALU) a multiplication unit (MPU), ALGORITHM, and CONTROL 208. The input registers 202, 204 and the general purpose registers GP1, GP2 and logic units ALU and MPU, ALGORITHM and CONTROL are connected via a bus 206. The ALGORITHM also includes a SCALING component that is used to convert values of variables to different scales and for aligning digital representations of the variables. For example, one variable on a first scale is stored in GP1 and another variable on a second scale is stored in GP2. The scaling component can convert either GP1 and/or GP2 to a common scale for processing by the ALU or the MPU. CONTROL 208 controls processing of the algorithm as well as the loading and moving data between the registers via bus 206 as needed by the algorithm.

As an example, CONTROL 208 could have the data at input register 202 loaded into GP1, and store in GP2 another value to be combined with the value in GP1. CONTROL 208 can then employ SCALING component to perform any scaling of GP1 and GP2 for the algorithm (e.g., by shifting the register or by adding a constant for alignment) and then send the values in GP1 and GP2 to the ALU (for adding) or to the MPU (for multiplying). CONTROL 208 then directs the output from the ALU or MPU directed to one of the general purpose registers GP1, GP2. As shown in FIG. 2, the output can be obtained from GP1; however, the output can be obtained from GP2, or any other register, if desired. The output thus represents a digitally compensated version of the parameter provided to register 202, corrected for gain and offset errors associated with an amplifier.

Figure 3:
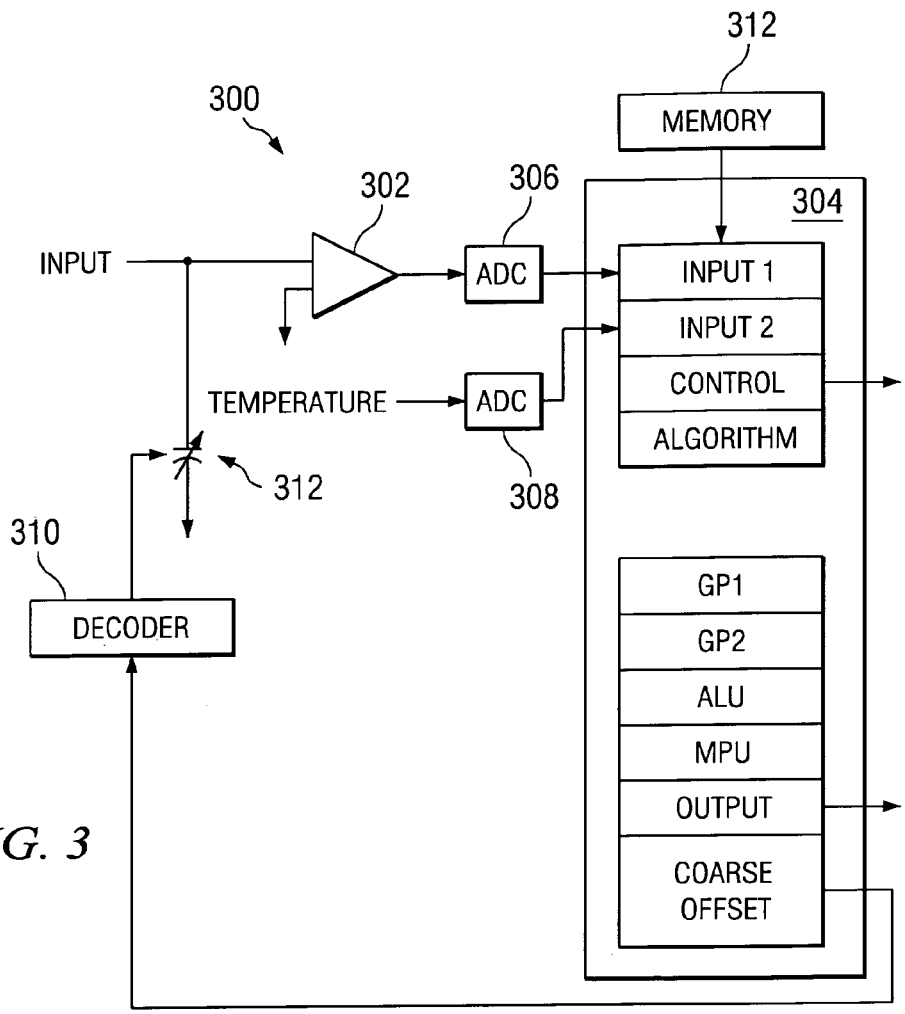
FIG. 3 is a block diagram of an amplifier with a digital compensation system implemented in accordance with an aspect of the present invention.

FIG. 3 illustrates another example of a system 300 that can be implemented in accordance with an aspect of the present invention. The system 300 includes an analog amplifier 302 and a DSP 304 for implementing digital compensation of amplifier 302. For example, DSP 304 is programmed and configured to implement gain and/or offset correction for amplifier 302 based on one or more of temperature and predetermined operating characteristics of the amplifier.

DSP 304 includes input registers INPUT 1 and INPUT 2 general purpose registers GP1, GP2 and logic units ALU and MPU for performing addition and multiplication, respectively. The output of amplifier 302 is converted to a corresponding digital representation by analog-to-digital (ADC) 306. ADC 306 provides the digital representation to DSP 304. An analog temperature signal is input into ADC 308, and the digital representation of the temperature is input DSP 304. For example, the temperature signal can be provided by a temperature sensor, such as can be provided based on current across a resistor or another temperature sensitive device.

DSP304 also includes a coarse offset module (COARSE OFFSET) that sets a coarse level of offset for amplifier. COARSE OFFSET is connected to decoder 310 for providing a digital value corresponding to desired offset decoder 310 is coupled to variable capacitor 312 to establish a capacitance value that defines the COARSE OFFSET of amplifier 302. Other types of circuitry could also be employed to implement desired coarse offset adjustments on amplifier 302. As shown, the coarse offset module is contained within DSP 304, however, coarse offset adjustment may be implemented by other circuitry, such as another DSP, or even by an analog process. The coarse offset can be preset, adjusted by the compensation system, or be set by an analog process. The coarse offset setting can be stored in a programmable register associated with DSP 304. The value of the coarse offset can, for example, be programmed into a register, or it may be provided by a DAC (not shown) coupled to the analog coarse offset signal. The range and step for coarse offset vary based on the range of the coarse offset and the number of bits provided for the value of the coarse offset. For example, if the coarse offset has 9 bits and covers the range: 125 mV–(–125 mV), which provides a total range of 250 mV. Then coarse offset step (Costep) can be represented as:

$$Costep = \frac{\text{range}}{2^9} = 488.281 \times 10^{-6} V.$$

By way of further example, variable capacitor 312 can be a capacitor bank. Decoder 310 sends a signal to set the capacitance of capacitor 312 based on the signal provided by the coarse offset module. Non-volatile memory 314 (e.g., an EEPROM) stores compensation coefficients used by DSP 304 for calculating the compensation factors. The coefficients can be programmed by the designer or manufacturer based on circuitry used to implement the system 300.

In operation, the output from amplifier 302 is converted by ADC and stored in register INPUT1 in DSP 304. Temperature is converted to the digital domain via ADC 308 and stored in register INPUT2 of DSP 304. DSP 304 calculates the compensation for amplifier 302. The compensation factors are computed by CONTROL employing the algorithm that is configured to access compensation coefficients from memory 314. ALU and MPU combines compensation coefficients with the data stored in registers INPUT1 and INPUT2 based on ALGORITHM. DSP 304 utilizes registers GP1 and GP2 to store intermediate results. The final result, corresponding to a digitally compensated representation of the amplified input signal, can be stored in the OUTPUT register.

Figure 4:
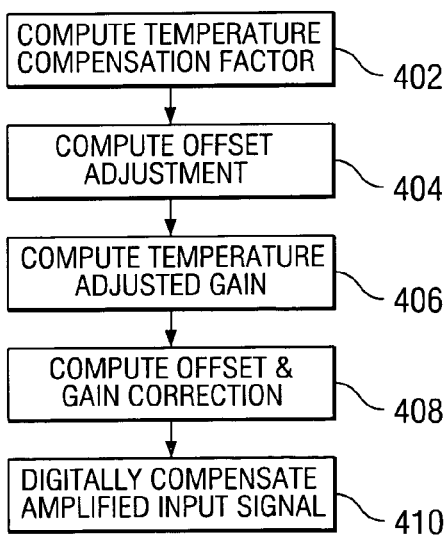
FIG. 4 is a flow diagram illustrating a method in accordance with an aspect of the present invention.
Figure 5:
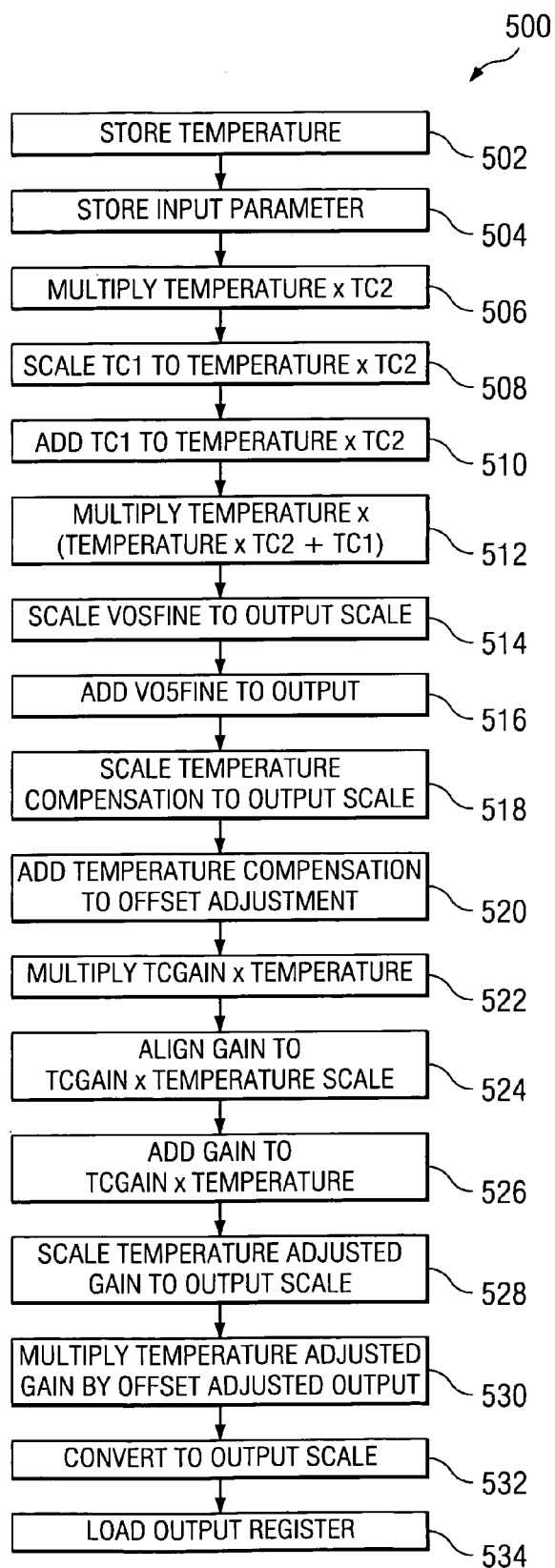
FIG. 5 is a flow diagram of another method in accordance with an aspect of the present invention.

In view of the examples shown and described above, a methodology for digital compensation in accordance with the present invention will be better appreciated with reference to the flow diagrams of FIGS. 4–5. While, for purposes of simplicity of explanation, a methodology is shown and described as executing serially, it is to be understood and appreciated that the methodology is not limited by the order shown, as some aspects may, in accordance with the present invention, occur in different orders and/or concurrently from that shown and described herein. Moreover, not all features shown or described may be needed to implement a methodology in accordance with the present invention. Additionally, such methodology can be implemented in hardware (e.g., one or more integrated circuits), software (e.g., running on a DSP or ASIC) or a combination of hardware and software.

Referring to FIG. 4, there is illustrated a methodology 400 in accordance with an aspect of the present invention. The methodology 400 employs two parameters, namely an amplifier output signal indicative of a first parameter (e.g., weight) and a signal indicative of a second parameter (e.g., temperature), and determines a digitally compensated representation of the amplified output signal. At 402, a temperature compensation factor is computed. This factor can be computed by combining the temperature with temperature compensation coefficients. The coefficients can be programmed by the designer or manufacturer based on circuitry utilized to implement the methodology 400. At 404, an offset adjustment is calculated. The offset adjustment is calculated by adding a fine offset adjustment factor to the amplifier output. The fine offset adjustment factor can be programmed by the designer or manufacturer. The fine offset adjustment factor, for example, can vary as a function of the step size of the coarse offset and/or the gain of the amplifier. At 406, a temperature adjusted gain is calculated. The temperature adjusted gain can be calculated by multiplying a gain temperature coefficient with the temperature. The gain temperature coefficient can also be programmed by the designer or manufacturer. The product of the gain temperature coefficient and temperature is added to a digital representation of the amplifier's gain. At 408, the offset and gain correction is computed by combining the temperature compensation factor, offset adjustment, and the temperature adjusted gain. At 410, the offset and gain correction is combined with the amplifier output signal. The result provided at 410 is a digitally compensated representation of the amplifier output signal.

FIG. 5 illustrates another methodology 500 that can be implemented in accordance with an aspect of the present invention. The methodology 500 may be performed by a DSP to minimize size requirements. The first input (e.g., the output of a weight sensor) is amplified and converted to a corresponding digital representation by an ADC and input into a compensation system. The ADC, for example, provides a 14 bit digital representation (ADC scale) of the amplified sensor output. A second input (e.g., temperature) is converted by a second ADC that provides a 12 bit digital representation of the temperature. Assume, for example, that the desired output is a 10 bit digital word. For this example, the value of the least significant bit (LSB) of the digital temperature value is 0.038° C. and the value of the LSB of the digital, amplified sensor signal is 305.2 µV.

In addition, the system is provided with programmable parameters for an input offset trim range, first and second temperature compensation coefficients, gain, and a gain temperature compensation factor. For example, the input offset trim range (Vos) has a range from –120 to 120 mV, an offset trimming step of 2 µV, and a trimming resolution of 17 bits. A first temperature compensation factor (TC1) can have an input offset trim range of approximately –2 to 2 µV/deg C., a trim step of about 40 nV/deg C., and a 7 bit resolution. A second temperature compensation factor (TC2) has a range of –37 to 37 µV/° C.$^2$, a trim step of about 0.62 nV/deg C.$^2$, and is represented digitally by 7 bits. The programmable gain range (GAIN) is 75 to 125% with a gain programming step of 0.1% and a programming resolution of 9 bits. The gain temperature compensation factor (TCGAIN) ranges is from –900 to 0 ppm/C with a trimming step of 15 ppm/C and a 6 bit resolution.

For this example, coarse offset compensation of the amplifier is performed in the analog domain based on a digitally selected value. Assume that the coarse offset is represented digitally by 9 bits and covers the range from –125 mV to +125 mV (a range of 250 mV). Therefore, the coarse offset step (Costep) can be computed as:

$$Costep = \frac{range}{2^9} = 488.281 \times 10^{-6} V.$$

In this example, analog domain introduces errors due to matching in capacitors in the DAC, such as approximately ±3 lsbs. Assuming for this example that the analog gain (Av) is approximately 300. The coarse deviation equals Costep) *3=1.465×10$^{-3}$V. The deviation times the analog gain is 1.465×10$^{-3}$V*300=0.439V.

The coarse error (coerr) can be represented as:

$$coerr = \text{coarse deviation} * 2 * Av + \frac{Costep}{2}.$$

Using the values of this example, coerr=0.879V.

One approach to implement the digital corrections would be to make all of the scales binary multiples of each other based on the highest resolution scale (which for this example is the ADC scale, 14 bits). This way the codes and their shifts can easily be manipulated and the only loss of resolution occurs when the values are converted to the 10 bit output scale.

At 502, the first input parameter (e.g., a 12 bit digital representation of temperature) is stored. At 504, the second input parameter (e.g., a 14 bit digital representation of the amplifier output, such as from an ADC) is stored.

The temperature coefficient calculations (the combination of 506, 508 and 510) for offset will now be described. The temperature coefficient calculations deal not only with voltage on the ADC scale, but also temperature on the degree scale.

The temperature calculations can be performed as:

DEG*(TC1+TC2*DEG), where DEG is the temperature in degrees Celsius, TC1 and TC2 are temperature coefficients, such as mentioned above.

The calculation can be done this way in order to save a calculation step. The result can be resolved to the scale of the ADC at the end of the calculations to minimize translation error.

The calculations at 506–510 can be performed independently whenever the temperature is updated and saved for the offset correction step or done each time the first input parameter is updated as part of the overall calculation.

At 506, the second input parameter stored at 504 is multiplied by the temperature compensation coefficient (TC2). TC2 can be programmed by the designer or manufacturer. The result can be stored in a general purpose register.

Using the above example parameters, TC2 has an input referred step of 0.62 nV/deg C. The step size for TC2 (Tc2step) after factoring in the gain of the amplifier is:

Tc2step=Tc2vosSpec·Av, or Tc2step=186×10$^{-9.}$

Assume codes for TC2 are represented by 7 bits 2's complement values, with a range from −64 to +63 and the LSB is equal to the tc2step value just calculated, namely 186×10$^{-9}$V/deg C. In this example, the temperature codes are 12 bits with a range of 100 to −55 deg C. Therefore, the temperature step value (tempstep) can be represented as:

$$Tempstep = \frac{155}{2^{12}} = 0.038°C.$$

After the code for the temp coefficient is multiplied with the temperature, the output (Tt2step) would have a scale of:

Tt2step=Tempstep·tc2step=7.039×10$^{-9}$ volts/deg C., is the value of the LSB.

At 508, temperature coefficient (TC1) is scaled to the same scale of the result of TC2*temperature (e.g., 28 bits). The scaled representation of TC1 can be stored in a general purpose register. To convert TC1 to the TC2 scale, which is a finer scale, generally requires adding bits to the right hand side of the binary point on the 7 bit TC1 code and multiplying by an appropriate scale factor.

A code of 1 would have a step value (tc1step) on the TC1's original scale (tc1scale) that can to be mapped onto the tt2step scale, by using the formula:

code*tc1step=newcode*2tt2step.

A maximum code on the tc1 scale would exist when tc1 code=−64. This results in:

$$tt2code = \text{floor}\left(tc1code \cdot \frac{tc1step}{tt2step}\right) = -109114.$$

The number of bits required for performing the above calculation corresponds to:

$$tc1code \cdot tc1step = -0.001 = \text{ceil}\left(\frac{\log(|tt2code|)}{\log(2)}\right) = 17.$$

Therefore, 17 bits are needed to hold this max value.

As previously calculated in this example, tt2step=7.039×10$^{-9}$ and tc1step−12×10$^{-6}$ In order to align the bits of TC1 to tt2step, TC1 is multiplied by:

$$\text{Floor}\left(\frac{tc1step}{tt2step}\right) = 1704.$$

TC1 would have to have bits added on the right of the binary point when multiplying by this scale factor. Then, TCScaleConst·tt2step=11.994×10$^{-6}$ The error (Err) introduced by this conversion can be expressed as:

Err=|TCScaleConst·tt2step−tc1step|, resulting in error equal to about 6.27×10$^{-9}$ error per bit. The error in the ADC scale can be expressed as:

$$\frac{Err}{adcstep} = 20.544 \times 10^{-6}$$

The maximum error from this scaling will be at either the maximum negative or positive code such as: error·64=401.25×10$^{-9}$.

At 510, scaled TC1 is then added to the product of TC2 and temperature from 506. Using the example parameters, the maximum value of this calculation would provide at most 20 bits. The result can be scaled to 14 bits in preparation for multiplication by temperature, as performed at 512.

Such scaling to 14 bits can be performed by a right shift of 6 bits such that the lower 14 bits places the volts in the desired scale. The shift step (tt2Shfitedstep) can be represented as:

$$tt2\text{Shiftedstep} = tt2\text{step} \cdot 2^{-6} = 450.469 \times 10^{-9}.$$

The above value of tt2Shiftedstep corresponds to the value of the LSB of a right shifted scale by 6 bits, and then taking the lower 14 bits.

The error mapped to the ADC scale from this calculation can be expressed as:

$$\frac{tt2\text{Shiftedstep}}{adcstep} = 1.476 \times 10^{-3}$$

The maximum error is at the maximum possible code for this calculation or when: TC1=−64; TC2=−64; and the Temperature=100 deg C. This error can be calculated as:

$$tt2\text{Shiftedstep} \cdot \text{Tempstep} = 17.047 \times 10^{-9}.$$

At 514, the fine offset coefficient (VOSFINE) is scaled to the scale of the digital representation of the amplifier output ADC scale (e.g., 14 bits). In the present example, it is assumed that the code for VOSFINE is 0 to 255 unsigned. The coarse offset step size is about 2 µV input referred. Multiplying VOSFINE by the gain in the signal path produces the value of the offset at the amplified sensor output of the ADC. Multiplying VOSFINE by the gain introduces an error (voserr) into the calculations. This error (voserr) can be represented as:

$$voserr = 5 \ 10^{-3} \ Av; \ voserr = 150 \times 10^{-3},$$

which equals the output referred maximum value. The step value of the offset (offsetstep) becomes:

$$offsetstep = 2 \ 10^{-6} \ast Av = 600 \times 10^{-6}.$$

The offsetstep is also the value of the offset LSB. However, as noted above, the ADC scale is on a different scale. The ADC LSB (adcstep) is:

$$adcstep = \frac{5}{2^{14}} \ adcstep = 305.176 \times 10^{-6}.$$

Thus, the fine offset value cannot just be added to the amplified output value since they are not on the same scale, nor are they binary multiples of each other. The offset code thus can be converted to the ADC scale before being added to the amplified output value. Recall that the offset code was previously calculated as: offstep=600×10⁻⁶. To convert the offset value to the ADC scale, the conversion factor is:

$$\frac{offsetstep}{adcstep} = 1.966$$

By moving the ADC binary point Y bits this code provides:

$$ceil\left(\frac{offsetstep}{adcstep} \cdot 2^6\right) = 126,$$

therefore, Y=6.

A constant (CONSTVOS) for multiplying the fine offset value to convert it to the ADC scale can be expressed as:

$$CONSTVOS = ceil\left(\frac{offsetstep}{adcstep} \cdot 2^Y\right) = 126.$$

Multiplying the fine offset by this factor would scale the offset to a value close to the ADC scale shifted by Y bits.

Converting from the ADC scale to the VOS scale can be performed by using the formula (newcode*scale1=oldcode*scale2). The voscode is multiplied by a scale factor VOSCONST and the new code is added to the value of the ALU which has been shifted by the shift factor (vcode). This scaling can be expressed as:

$$vcode \ast CONSTVOS \ast adcstep \cdot 2^{-6} = 153.208 \times 10^{-3};$$

and $$vcode \ast offsetstep = 0.153.$$

The maximum error due to the truncation of the scale factor on the adc scale, where Voff=2⁸; offsetstep=6×10⁻⁴; and adcstep=3.052×10⁻⁴ can be expressed as:

$$\frac{|voff \cdot offsetstep - voff \cdot CONSTVOS \cdot (adcstep \cdot 2^{-Y})|}{adcstep} = 0.684 \ \text{lsbs}.$$

Thus, for the example given, to scale VOSFINE to the output scale, VOSFINE is multiplied by 126. At 516, the scaled fine offset (VOSFINE) is added to the amplified sensor output. The amplified sensor output can be sign extended for the addition. The LSB of the result of the addition is 4.768 µV.

The result of the addition is right shifted arithmetically by 6 bits so that the value of the LSB is approximately 305.2 µV.

At 518, the total temperature compensation term (TC2*temperature+TC1)*temperature, is scaled to align with the ADC scale. The temperature compensation term is left shifted by 10 bits, making the value of the LSB 27.7 pV. An additional scaling factor, a constant of about 98 can be multiplied by the shifted temperature compensation term to align the bits to the ADC scale. The result is right shifted by 10 bits, making the 10ᵗʰ bit's value 298 nV.

At 520, the scaled temperature compensation term (calculated at 518) is added to the offset adjusted output (calculated at 516). Because the offset adjusted output's LSB is 305.2 µV, it is left shifted 10 bits for adding, making its LSB 298 nV, the same as the scaled temperature compensation term. The addition is then performed and the result is right shifted by 10 to convert the result back to the ADC scale (LSB=305.2 µV).

Gain calculations and scaling are performed at 522, 524, 526 and 528. By way of example, gain can be stored in a programmable register of 9 bits representing 75% to 125% of desired gain in steps of 0.1% (e.g., 75 to 1.25 in 0.001 steps). The gain temp correction (TCGAIN) is stored in a programmable register with 6 bits covering a range of 900 ppm to 0 ppm, in steps of 15 ppm/C.

The codes for gain (gain codes) can represent amplifier gain from 0 to 511. The gain codes can be represented in 2's complement codes with 0 meaning gain of 1. For an uncorrected case the gain can be calculated as:

1+gaincode*0.001, where gaincode may vary from −256 to 255.

If a code on the ADC scale is multiplied by the gain factor code, the result would be on the ADC scale. The maximum error can be calculated using the maximum values for adcCode and gain. For example, if adcCode=255, then addcstep·acdCode=0.07, and adcstep=305.176×10$^{-6}$. If the gain=1.25 (the maximum value for gain), then gain·adcstep·adcCode=97.275×10$^{-3}$. Setting the gaincode to the maximum value (e.g., gaincode=255), then gaincode0.001+1=1.255. The gain step (gstep)=0.001, then gaincode·gstep+1=1.255×10$^{-3}$, floor[adcCode·(gaincode·2$^{-10}$+1)]=318 and 318·adcstep=97.046×10$^{-3}$.

Therefore, the maximum error is can be expressed as:

$$\frac{|(gain \cdot adcstep \cdot adcCode) - adcCode \cdot (gaincode \cdot 2^{-10} + 1) \cdot adcstep|}{(adcstep)} = 249.023 \times 10^{-3}$$

The gain is then combined with the temperature calculations that were performed at 506-512. When the 15 ppm step of this example is multiplied by the temperature, the value of the resultant value is unitless like the gain but value of the LSB is not the same as the gain code step calculated above. For a specific ambient temperature and gain code, the adjustment can be calculated to the gain for temperature correction. To facilitate adding this to the gain code for the non-temperature dependent gain adjustment, the two codes should be on the same scale.

By way of further example, the TCGAIN step (TCGstep)=15·10$^{-6}$, then the resulting scale becomes TCGstep·Tempstep=567.627×10$^{-9}$. Further, assume that Tcg1step=TCGstep·Tempstep, that the gain step, (Gainstep)=2$^{-11}$, and that Tcg1step·2$^{11}$=1.162×10$^{-3}$. Thus, the closest value on the temperature scale to the gain step scale is between the 10$^{th}$ and 11 bits of the gain step scale. This provides that gainsstep·2$^{-11}$=238.419×10$^{-9}$.

So a corresponding binary factor on the gain scale would be 2$^{-11}$ or 2$^{-11}$=488.281×10$^{-6}$. To get a closer factor on the gain scale, the factor would have to be non-binary and additional bits would be required. For example, $$\frac{\frac{1}{2048}}{tcg1step} = 860.215$$

where: tcg1step=567.627×10$^{-9}$ and $$\frac{1}{2048} = 488.281 \times 10^{-6}$$

Using the smaller scale for the add function, the gain code could be shifted left by 11 bits first and the two values then added to provide a temperature adjusted gain. The error in doing this would be the difference in the two scales in LSBs is TCGCODE=−63

$$\left| \frac{(tcg1step - adcstep \cdot 2^{-11}) \cdot TCGCODE}{adcstep} \right| = 0.086 \text{ (lsbs)}$$

Using the maximum possible values in this example, Atemp=100; TCGAIN=−64; and Tempstep=0.038, then the maximum possible error becomes:

[(Atemp−25)·TCGAIN·TCGstep]=−0.072.

At 522, the gain temperature coefficient (TCGAIN) is multiplied by the temperature (TCGAIN*GAIN). The result has a LSB value of 567×10$^{-9}$.

At 524, the result of the TCGAIN*GAIN calculation is scaled to the Gain scale. The TCGAIN*GAIN LSB value is 567×10$^{-9}$. By multiplying by a constant of 9, the scale is converted so that the LSB is 61×10$^{-9}$.

At 526, the scaled value of TCGAIN*GAIN is added to the Gain. The gain scale also has a LSB of 61×10$^{-9}$. The 11$^{th}$ bit has a value of 1×10$^{-6}$, by shifting the result of the add to the right by 10 bits, the LSB of the result is 1×10$^{-6}$.

At 528, the temperature adjusted gain is adjusted to the ADC scale. At 530, the temperature adjusted gain (from 528) is multiplied by the offset adjusted output (from 520) to provide a digital offset and gain correction. The offset adjusted output is left shifted by 10 to align it with the temperature adjusted gain. For this calculation, the multiplicand is 24 bits. The result is right shifted by 10 bits to realign the result with the ADC scale, namely the LSB=305.2 μV.

At 532, the gain and offset correction factor is then converted to a 10 bit scale, the desired output scale of this example. The conversion can be performed by multiplying the offset and gain correction by a constant of 1924. A constant of 366 can be added to the 10 bit representation of the offset and gain correction to center the values on the new scale.

At 534, the output register is loaded with the result. The result may be passed through limiting logic in order to limit how much correction is allowed. A signal can be sent after the register is loaded so an external process can determine when the calculation is done.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for signal processing, comprising:
a compensation system configured to provide a digitally compensated representation of a first amplified analog signal indicative of a first parameter based on a digital representation of the first amplified analog signal and a digital representation of a second signal indicative of a second parameter, the digitally compensated representation of the first amplified analog signal being determined by applying a pre-stored compensation factor to an offset adjustment calculation for the second parameter to provide a compensated offset adiustment, the compensated offset adjustment being combined with an adjusted gain to provide offset and gain correction for weighting the first parameter to provide the digitally compensated representation of the first parameter; and
a scaling component that scales the digital representation of the first amplified analog signal to a first scale and scales the digital representation of the second signal to a second scale, the compensation system converting at least one of the digital representation of the first amplified analog signal and the digital representation of the second signal to a scale that is compatible with the first and second scales.

2. The system of claim 1, the compensation system converting the offset and gain correction to an output scale that is different from the first and second scales.

3. A compensation system that implements offset and gain correction for an analog circuit, comprising:
a first register that stores a temperature compensation factor based on a digital representation of a temperature and a temperature compensation coefficient;
a second register that stores an offset adjustment calculation from a digital representation of an amplified signal and a fine offset coefficient; and
a processor that produces a temperature compensated offset adjustment based on the temperature compensation factor and the offset adiustment, the processor storing the temperature compensated offset adjustment in one of the first and second registers, the other of the first and second registers storing a calculated temperature adjusted gain based on the digital representation of the temperature, and a pain coefficient, the processor employing the temperature adjusted gain and the temperature compensated offset adjustment to provide an offset and gain correction, wherein, the digital representation of the amplified signal is scaled to a first scale and the digital representation of a temperature is scaled to a second scale, the processor converting at least one of the digital representation of the first amplified analog signal and the digital representation of the temperature to a compatible scale.

4. A system for signal processing, comprising:
means for providing a digital representation of a first amplified analog signal indicative of a first parameter;
means for providing a digital representation of a second analog signal indicative of a second parameter;
means for applying a pre-stored compensation factor to an offset adjustment calculation employing the second parameter to provide a compensated offset adjustment;
means for determining an adjusted gain based on a prestored gain factor and the second parameter;
means for combining the comoensated offset adjustment with the adjusted gain to provide offset and gain correction; and means for weighting the first parameter employing the offset and gain correction to provide a digitally compensated representation of the first parameter;
means for scaling the digital representation of the first amplified analog signal to a first scale and for scaling the digital representation of the second analog signal to a second scale; and
means for converting at least one of the digital representation of the first amplified analog signal and the digital representation of the second analog signal to a scale that is compatible with at least one of the first and second scales.

5. A method for compensating for error in an analog amplifier, comprising:
determining a temperature compensation factor based on a digital representation of a temperature and a temperature compensation coefficient;
determining an offset adjustment for a digital representation of an analog amplifier signal based on a fine offset coefficient;
determining a temperature adjusted gain for the amplifier based on the digital representation of a temperature and a gain coefficient;
determining an offset and pain correction based on the temperature compensation factor, the offset adjustment, and the temperature adjusted gain; and
scaling the temperature compensation factor to match the scale of the offset adjustment.

6. A method for compensating for error in an analog amplifier, comprising:
determining a temperature compensation factor based on a digital representation of a temperature and a temperature compensation coefficient;
determining an offset adjustment for a digital representation of an analog amplifier signal based on a fine offset coefficient;
determining a temperature adjusted gain for the amplifier based on the digital representation of a temperature and a gain coefficient;
determining an offset and gain correction based on the temperature compensation factor, the offset adjustment, and the temperature adjusted gain; and
storing the temperature compensation factor in a first register, and storing the offset adjustment in a second register.

7. The method of claim 6, further comprising:
combining the offset adjustment with the temperature compensation factor to produce a temperature compensated offset adjustment; and storing the combined offset adjustment with the temperature compensation factor in a one of the first and second registers.

8. The method of claim 7, further comprising storing the temperature adjusted gain in a one of the first and second registers that does not contain the combined offset adjustment with the temperature compensation factor.

* * * * *